US00RE47171E

(19) United States
(12) Reissued Patent
Lin

(10) Patent Number: US RE47,171 E
(45) Date of Reissued Patent: *Dec. 18, 2018

(54) INTEGRATED CIRCUIT DEVICE HAVING PADS STRUCTURE FORMED THEREON AND METHOD FOR FORMING THE SAME

(71) Applicant: REALTEK SEMICONDUCTOR CORPORATION, Hsinchu (TW)

(72) Inventor: Ying-Hsi Lin, Hsinchu (TW)

(73) Assignee: REALTEK SEMICONDUCTOR CORPORATION, Hsinchu (TW)

( * ) Notice: This patent is subject to a terminal disclaimer.

(21) Appl. No.: 15/253,539

(22) Filed: Aug. 31, 2016

Related U.S. Patent Documents

Reissue of:
(64) Patent No.: 6,787,928
Issued: Sep. 7, 2004
Appl. No.: 10/425,973
Filed: Apr. 30, 2003

U.S. Applications:
(63) Continuation of application No. 14/743,421, filed on Jun. 18, 2015, now Pat. No. Re. 46,784.

(30) Foreign Application Priority Data

Feb. 26, 2003 (TW) ..... 92104606

(51) Int. Cl.
*H01L 23/48* (2006.01)
*H01L 23/485* (2006.01)
*H01L 23/00* (2006.01)

(52) U.S. Cl.
CPC ..... *H01L 24/05* (2013.01); *H01L 24/03* (2013.01); *H01L 24/48* (2013.01);
(Continued)

(58) Field of Classification Search
CPC ..... H01L 24/03; H01L 27/05; H01L 24/48; H01L 2924/00014; H01L 2924/30105; H01L 2924/01006; H01L 2924/01005; H01L 2224/85399; H01L 2224/02166; H01L 2224/04042; H01L 2224/05093; H01L 2224/05095; H01L 2224/05558;
(Continued)

(56) References Cited

U.S. PATENT DOCUMENTS 5,284,797 A * 2/1994 Heim ..... 438/612
5,502,337 A * 3/1996 Nozaki ..... H01L 23/5283 257/773

(Continued)

FOREIGN PATENT DOCUMENTS

JP 2000299319 A 10/2000

*Primary Examiner* — Norca L. Torres Velazquez
(74) *Attorney, Agent, or Firm* — Sughrue Mion, PLLC

(57) ABSTRACT

The invention is to provide a structure of IC pad and its forming method. The structure is arranged in an insulation layer and is comprised of a lower electric-conduction layer, a compound layer structure and a pad layer. The lower electric-conduction layer is arranged at an appropriate position in the insulation layer and is connected to an electric potential. The compound layer structure is arranged on the insulation layer and is composed of at least one electric-conduction layer and at least one electric-conduction connecting layer, both are inter-overlapped to each other. The pad layer is arranged on the compound layer structure.

16 Claims, 5 Drawing Sheets

(52) U.S. Cl.
CPC ..... *H01L 2224/02166* (2013.01); *H01L 2224/04042* (2013.01); *H01L 2224/05093* (2013.01); *H01L 2224/05095* (2013.01); *H01L 2224/05558* (2013.01); *H01L 2224/05599* (2013.01); *H01L 2224/48463* (2013.01); *H01L 2224/85399* (2013.01); *H01L 2924/00014* (2013.01); *H01L 2924/01004* (2013.01); *H01L 2924/01005* (2013.01); *H01L 2924/01006* (2013.01); *H01L 2924/14* (2013.01); *H01L 2924/30105* (2013.01)

(58) Field of Classification Search
CPC . H01L 2224/05599; H01L 2224/48463; H01L 2224/45099
USPC ..... 257/779, 782, 784, 786
See application file for complete search history.

(56) References Cited

U.S. PATENT DOCUMENTS

| | | | | | |
|---|---|---|---|---|---|
| 5,736,791 | A * | 4/1998 | Fujiki et al. | ..... | 257/781 |
| 5,814,860 | A * | 9/1998 | Furuta | ..... | H01L 24/05 257/335 |
| 5,923,088 | A * | 7/1999 | Shiue et al. | ..... | 257/758 |
| 5,986,343 | A * | 11/1999 | Chittipeddi et al. | ..... | 257/758 |
| 6,023,095 | A | 2/2000 | Hirabayashi | | |
| 6,163,074 | A * | 12/2000 | Lee et al. | ..... | 257/734 |
| 6,163,075 | A | 12/2000 | Okushima | | |
| 6,313,537 | B1 * | 11/2001 | Lee et al. | ..... | 257/758 |
| 6,465,337 | B1 * | 10/2002 | Lee et al. | ..... | 438/612 |
| 6,717,270 | B1 * | 4/2004 | Downey | ..... | H01L 23/50 257/758 |
| 2001/0000928 | A1 * | 5/2001 | Lee et al. | ..... | 257/786 |
| 2001/0010407 | A1 | 8/2001 | Ker et al. | | |
| 2002/0145206 | A1 | 10/2002 | Park et al. | | |

* cited by examiner

INTEGRATED CIRCUIT DEVICE HAVING PADS STRUCTURE FORMED THEREON AND METHOD FOR FORMING THE SAME

Matter enclosed in heavy brackets [ ] appears in the original patent but forms no part of this reissue specification; matter printed in italics indicates the additions made by reissue; a claim printed with strikethrough indicates that the claim was canceled, disclaimed, or held invalid by a prior post-patent action or proceeding.

*This application is a continuation application of U.S. patent application Ser. No. 14/743,421, filed Jun. 18, 2015, which is a reissue application of U.S. patent application Ser. No. 10/425,973, filed Apr. 30, 2003, now U.S. Pat. No. 6,787,928, issued Sep. 7, 2004, which claims priority from Taiwanese Patent Application No. 92104606, filed on Feb. 26, 2003, the disclosure of which is incorporated herein by reference in its entirety. This application is also a reissue application of U.S. Pat. No. 6,787,928.*

FIELD OF THE INVENTION

The invention relates to a structure of IC pad and its forming method, in particular to a structure and method that are adapted to form a pad of integrated circuit of high frequency and low noise; not only the noise from the semiconductor substrate be separated effectively and the value of equivalent electric capacitance of the pad be lowered, but also the bonding adherence be further enhanced.

BACKGROUND OF THE INVENTION

Recently, since the requirement of transceiver of low power and low cost is steadily on the increase, so the technology of mainstream IC competitively concentrates on how to realize further more functions of radio frequency on one single chip. Except making integrated circuit be able to arrange on the package substrate, the external circuit connected by the external legs of package substrate must be electrically connected to the integrated circuit. So, when packaging the integrated circuit, the technology of pad has become an important factor that influences the yield and quality of a product. This pad adapted for providing electric connection between the integrated circuit and the external circuit is usually arranged in the metal zone around the IC die. When the pad is formed, the metal connecting wire must contact with the pad accurately and connect to the external legs of the IC packaging substrate. Because of the limitation of the prior arts and the characteristics of metal connecting wire and pad, the area of pad is sometimes too large to occupy too much area of chip. Furthermore, during high frequency, the performance of the integrated circuit is influenced because the equivalent electric capacitance is too large.

Additionally, because of the market growth of communication IC recently, the operational frequency of integrated circuit is also growing in indexing type. The low noise and low loss of high frequency signal are always the pursuing goals for communication IC.

In 1987, the U.S. Pat. No. 4,636,832 "Semiconductor device with an improved bonding section" proposed a design method of the pad of integrated circuit. Please refer to FIG. 1, which is a cross-sectional diagram of the IC device disclosed in the U.S. Pat. No. 4,636,832. The characteristic of this prior art is that the semiconductor element 10 is arranged below the pad 15. Although it may reduce the area of layout, this kind of pad can not be adapted to high frequency circuit with low noise because the noise coming from the semiconductor substrate 20 will directly influence the signal of high frequency when it passes through the pad.

To overcome the tensile and tension of bonding, the U.S. Pat. No. 5,248,903 "Composite pads for semiconductor devices" proposed a kind of pad. Please refer to FIG. 2, which is the cross-sectional diagram of the IC device disclosed in the U.S. Pat. No. 5,248,903. Wherein, the pad 30 has at least two layers of electric-conduction layer 30a and 30c and a connection layer 30b. But, this kind of pad is not adapted for the signals of high frequency and low noise because the noise of semiconductor substrate 35 will directly influence the quality of signal.

The U.S. Pat. No. 5,502,337 "Semiconductor device structure including multiple interconnection layers with interlayer insulating films" proposed a different designing method for pad. Please refer to FIG. 3, which is a cross-sectional diagram for the IC device disclosed in the U.S. Pat. No. 5,502,337, which arranges the connection layer 40a in the pad 40 around the bonding zone 45. When the integrated circuit is manufactured, a bonding zone of arc shape will be formed on the pad 40 to thereby enhance the bonding adherence. However, the technology of current integrated circuit has stepped into the levels of sub micrometer or deep sub micrometer, and CMP (Chemical-Mechanical Polish) is already a standard procedure for current semiconductor process. So, this kind of prior art no longer generates original effectiveness in current semiconductor process, besides this technique has the same drawback as that of previous techniques; i.e., it can not separate the noise coming from the semiconductor substrate 50.

From above discussion, we know that the prior arts described there are unable to propose an effective solution that aims for the high frequency, low noise and bonding adherence. Therefore, the emphasis of the invention is to provide a pad structure adapted for a integrated circuit of high frequency and low noise to lower down the equivalent electric capacitance and enhance the bonding adherence, such that it can prevent the entire pad from being drawn out of the semiconductor chip by the tension generated in the bonding procedure.

SUMMARY OF THE INVENTION

The main objective of the present invention is to provide a structure of IC pad and its forming method, which are adapted for the structure of the pad of an integrated circuit of high frequency and low noise, such that the effective area of the pad may be reduced effectively to thereby reduce its value of equivalent electric capacitance.

The second objective of the present invention is to provide a structure of IC pad and its forming method effectively separate the noise coming from the semiconductor substrate.

The further objective of the present invention is to provide a structure of IC pad and its forming method effectively enhance the bonding adherence, such that it prevent the entire pad from being drawn out of the semiconductor chip by the tension generated in the bonding procedure.

To achieve above objectives, the invention provides an IC pad structure arranged in an insulation layer comprises a lower electric-conduction layer, a compound layer structure and a pad layer.

The lower electric-conduction layer is arranged in the insulation layer and is connected to an electric potential.

The compound layer structure arranged on the insulation layer comprises at least one electric-conduction layer and at least one electric-conduction connecting layer, each of the electric-conduction layer are connected to each other.

The pad layer is arranged on the compound layer structure.

To achieve above objectives, the invention further presents method for forming IC pad structure, comprising the following steps of:

Step (a): providing a substrate arranged with an insulation layer.

Step (b): forming a lower electric-conduction layer which prepared connect to an electric potential.

Step (c): forming a compound layer structure composed by inter-overlapping or connect at least one electric-conduction layer and at least one electric-conduction connecting layer on the insulation layer.

Step (d): forming a pad layer on the compound layer structure, of which area is larger than that of the electric-conduction layer of the compound layer structure.

DETAILED DESCRIPTION OF THE INVENTION

For your esteemed member of reviewing committee to further recognize and understand the characteristics, objectives, and functions of the present invention, a detailed description together with corresponding drawings are presented thereinafter.

The invention discloses a structure of IC pad and its forming method. Its embodiments are described according to referential drawings, in which similar referential numbers represent similar elements.

Figure 1:
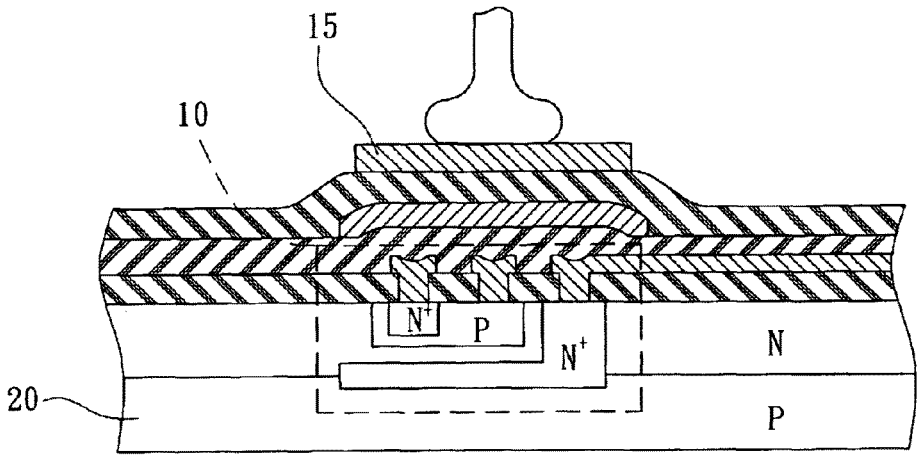
FIG. 1 (PRIOR ART)
FIG. 1 is a cross-sectional diagram for the IC device disclosed in the U.S. Pat. No. 4,636,832.
Figure 2:
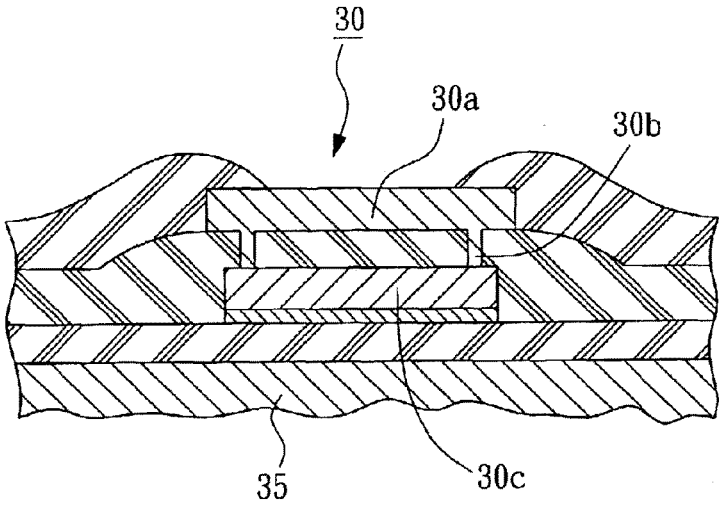
FIG. 2 (PRIOR ART)
FIG. 2 is a cross-sectional diagram for the IC device disclosed in the U.S. Pat. No. 5,248,903.
Figure 3:
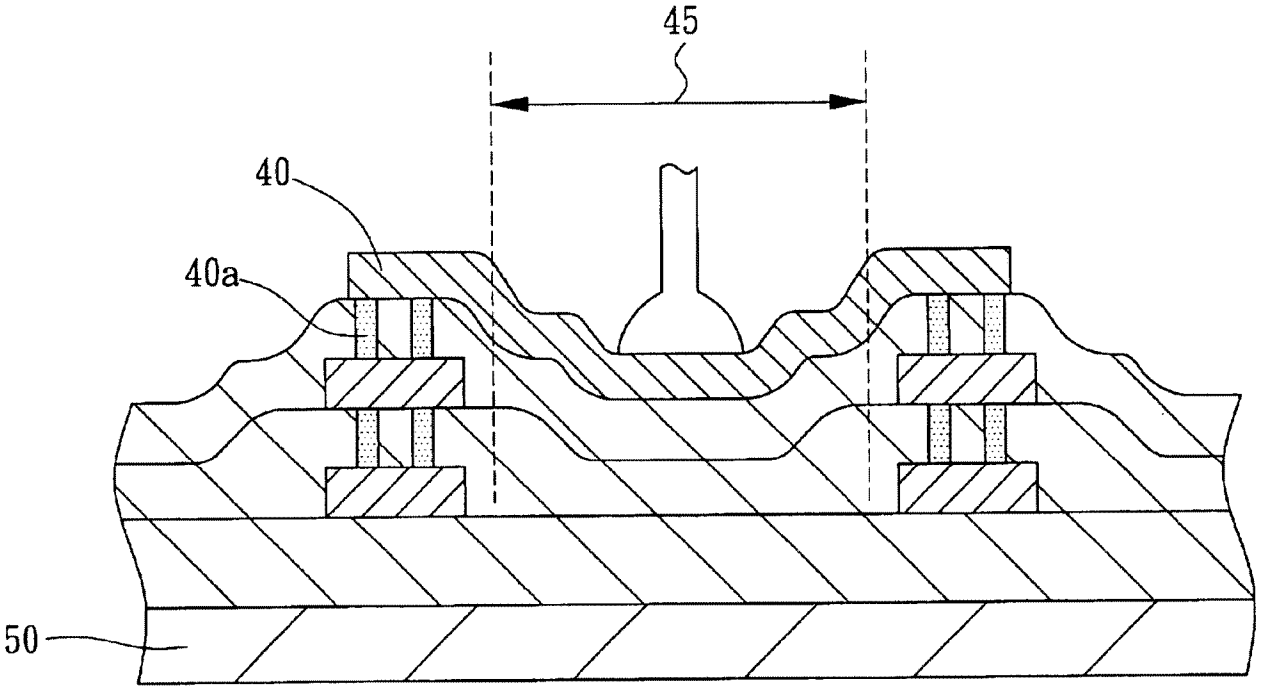
FIG. 3 (PRIOR ART)
FIG. 3 is a cross-sectional diagram for the IC device disclosed in the U.S. Pat. No. 5,502,337.
Figure 4:
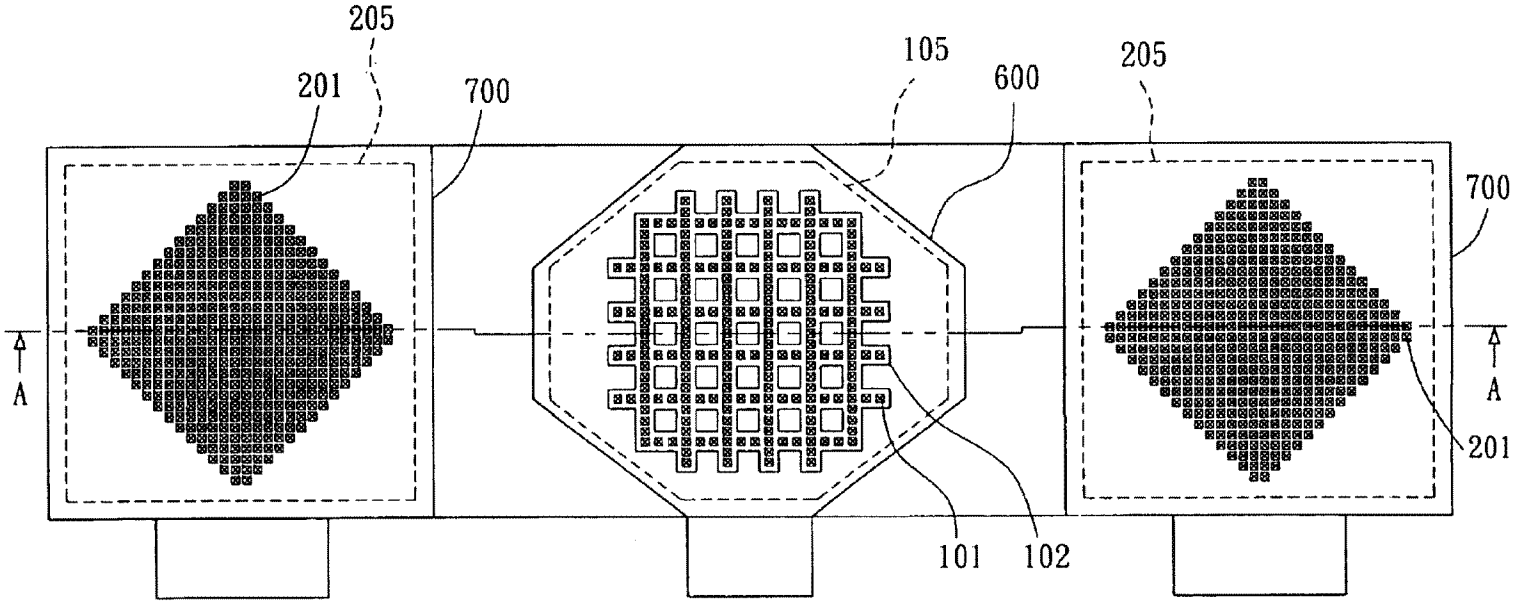
FIG. 4 is an upper side view for the structural illustration of a preferable embodiment of the IC pad according to the invention.
Figure 5:
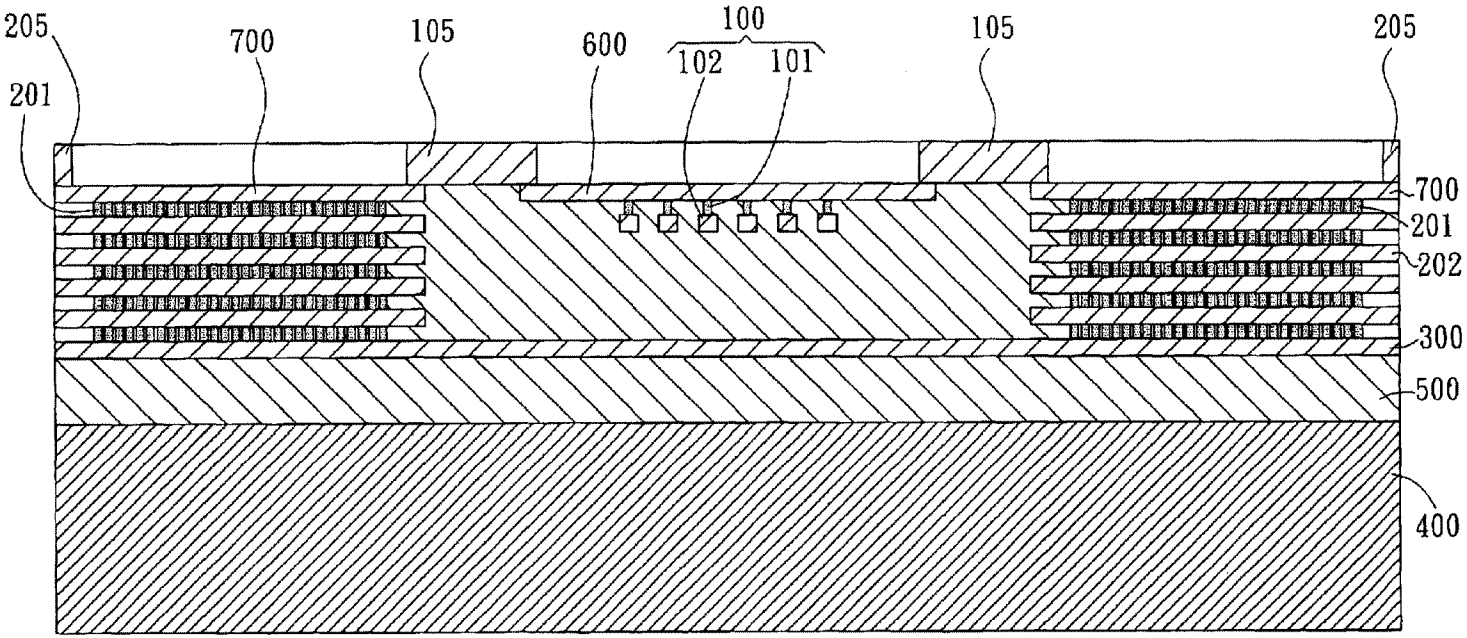
FIG. 5 is a cross-sectional view along the A-A line cutting through FIG. 4 illustrating the preferable embodiment of the IC pad according to the invention.

Please refer to FIG. 4 and FIG. 5, which are structural illustrations for the preferable embodiments of the IC pad according to the present invention. The IC pad structure includes a lower electric-conduction layer 300, a compound layer structure 100, and a first pad layer 600. The lower electric-conduction layer 300 formed at an appropriate position in the insulation layer 500 is coupled with plural electric-conduction layers 202 and plural electric-conduction connecting layers 201, shown in FIG. 5, such that the lower electric-conduction layer 300 may a voltage signal from a second pad layer 700 formed on the upper surface exposing on the insulation layer 500 through provide electric-conduction layers 202 and electric-conduction connecting layers 201 shown in FIG. 5, which further provides a connection to a device providing the voltage signal (not shown in the drawings). The second pad layer 700 further forms a bonding zone with a chip passivation layer 205 and 105. The noise transferred from the substrate [40] *400* will be kept away by the lower electric-conduction layer 300 which may be connected to a power source or voltage signal by the second pad layer 700.

The compound layer structure 100 is arranged on the insulation layer 500 and is composed of at least one electric-conduction layer 102 and at least one electric-conduction connecting layer 101, both which are inter-overlapped to each other. The pad layer 600 is arranged on the compound layer structure 100 and is adjacent to the top face side of the insulation layer 500. In the preferable embodiments according to the invention and in order to lower down the value of the effective capacitance of the entire pad, the pad layer 600 is realized by the structuring method of polygon shape and the area of the electric-conduction layer 102 is designed to be smaller than that of the pad layer 600, such that the value of the equivalent electric capacitance to the lower electric-conduction layer 300 may be further effectively lowered down. The electric-conduction layer 102 may be realized by the methods of railing structure or honeycomb structure that may reduce the area of electric-conduction layer 102. The electric-conduction connecting layer 101 further includes plural vias and plural via plugs. The structure of this electric-conduction connecting layer 101 may be modified and implemented by those who are skilled in such art according to above disclosure, but it still possesses the merits of the invention and is also within the spirit and scope of the invention, so repetitious description is not presented herein.

In the preferable embodiments according to the invention, the IC pad structure further includes a passivation layer 105, which is arranged on the insulation layer 500 and is partially connected to the pad layer 600. From above design, the compound layer structure 100 is signally connected and structured to the pad layer 600, and a steady bonding zone is thereby formed, such that it may enhance the boding tension and effectively raise the bonding adherence. Therefore, the tension generated during the bonding procedure to draw the entire structure of the IC pad out of the semiconductor chip may be prevented.

Figure 6:
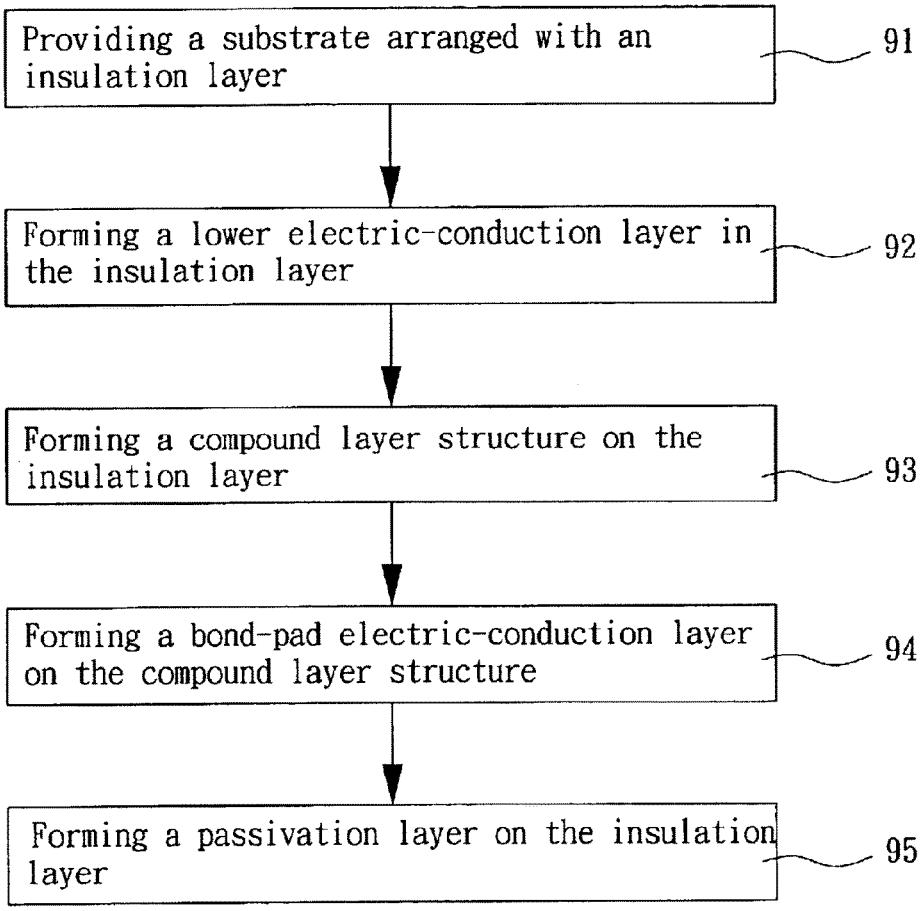
FIG. 6 is a flowchart illustrating the preferable embodiment of the method forming the IC pad according to the invention.

In order to further recognize and understand the characteristics, objectives and functions of the present invention, please refer to FIG. 6, which is a flowchart illustrating the preferable embodiment of the method forming the IC pad according to the invention, wherein the numbers 91, 92, 93, 94 and 95 shown in the drawing respectively illustrate the steps from (a) to (e) of the method forming the IC pad according to the invention.

Step (a): providing a substrate that is arranged with an insulation layer thereon.

Step (b): forming a lower electric-conduction layer at an appropriate position in the insulation layer; the lower electric-conduction layer is composed of plural electric-conduction layers and plural electric-conduction connecting layers. In this embodiment, each of the electric-conduction layer is interlaced-connected to the corresponding electric-conduction connecting layers, as shown in FIG. 5, such that a signal connection may be provided to a bond-pad electric-connection layer, which further forms a bonding zone with a passivation layer, such that the pad layer may be connected to a potential of cleaner power source or electric potential.

Step (c): a compound layer structure formed on the insulation layer is composed of at least one electric-conduction layer and at least one electric-conduction connecting layer, each of the electric-conduction layer is interlaced-connected to the corresponding electric-conduction connecting layers, as shown in FIG. 5, and the area of the electric-conduction layer can be reduced by the methods of railing structure or honeycomb structure, and the electric-conduction connecting layer further includes the structure of plural vias and plural via plugs.

Step (d): forming a pad layer on the compound layer structure, wherein the area of the former is larger than that of the electric-conduction layer of the latter, and the pad layer is structured as a polygon shape.

Step (e): forming a passivation layer on the insulation layer, such that the pad layer may form a bonding zone with the passivation layer.

Accordingly, the structure of an IC pad and its forming method according to the invention may indeed reduce the value of equivalent electric capacitance of the entire pad, separate the noise coming from the semiconductor substrate, and increase the bonding adherence, so this kind of designing method may be adapted to integrated circuit of high frequency and fulfill the requirement of high frequency and low noise.

What is claimed is:

[1. An integrated circuit (IC) device having a pad structure formed thereon, the IC device comprising:

a) a substrate;

b) an insulation layer formed on the substrate;

c) a lower electric-conduction layer formed in the insulation layer;

d) a compound layer structure formed in the insulation layer;

e) a first pad layer formed on the insulation layer and coupled to the compound layer structure, wherein the first pad layer and the compound layer structure are spaced apart from the lower electric-conduction layer; and f) a second pad layer formed on the insulation layer and coupled to the lower electric-conduction layer.]

[2. The IC device according to claim 1, wherein the compound layer structure comprises a first electric-conduction layer and a first connecting layer to couple the first electric-conduction layer to the first pad layer.]

[3. The IC device according to claim 2, wherein the first connecting layer comprises a plurality of via plugs.]

[4. The IC device according to claim 2, wherein the first electric-conduction layer is shaped like a webbed railing.]

[5. The IC device according to claim 2, wherein the area of the first electric-conduction layer is smaller than that of the first pad layer.]

[6. The IC device according to claim 1, wherein the first pad layer is shaped like a polygon.]

[7. The IC device according to claim 1, further comprising a passivation layer formed on the insulation layer to cover a part of the outer rim of at least one of the first and second pad layers.]

[8. The IC device according to claim 1, further comprising at least one second connecting layer for coupling the second pad layer to the lower electric-conduction layer.]

[9. The IC device according to claim 8, further comprising at least one second electric-conduction layer coupled between the second pad layer and the lower electric-conduction layer with the second connecting layer.]

[10. The IC device according to claim 1, wherein a noise from the substrate is kept away from the first pad layer by the lower electric-conduction layer.]

[11. An integrated circuit (IC) device having a pad structure formed thereon, the IC device comprising:

a) a substrate;

b) an insulation layer formed on the substrate;

c) a lower electric-conduction layer formed in the insulation layer;

d) a compound layer structure formed in the insulation layer; and e) a first pad layer formed on the insulation layer and coupled to the compound layer structure, wherein the first pad layer and the compound layer structure are spaced apart from the lower electric-conduction layer.]

[12. The IC device according to claim 11, wherein the compound layer structure comprises a first electric-conduction layer and a first connecting layer to couple the first electric-conduction layer to the first pad layer.]

[13. The IC device according to claim 11, further comprising a second pad layer formed on the insulation layer and coupled to the lower electric-conduction layer.]

[14. The IC device according to claim 13, further comprising at least one second connecting layer for coupling the second pad layer to the lower electric-conduction layer; and at least one second electric-conduction layer coupled between the second pad layer and the lower electric-conduction layer with the second connecting layer.]

[15. The IC device according to claim 14, wherein, the area of the first electric-conduction layer is smaller than that of the first pad layer.]

[16. The IC device according to claim 11, wherein the first pad layer is shaped like a polygon.]

[17. The IC device according to claim 11, further comprising a passivation layer formed on the insulation layer to cover a part of the outer rim of at least one of the first and second pad layers.]

[18. The IC device according to claim 11, wherein a noise from the substrate is kept away from the first pad layer by the lower electric-conduction layer.]

[19. A method for fabricating an IC device having a pad structure formed thereon, the method comprising:

a) providing a substrate;

b) forming an insulation layer formed on the substrate;

c) forming a lower electric-conduction layer formed in the insulation layer, at least a part of the lower electric-conduction layer being covered by the insulation layer;

d) forming a compound layer structure formed in the insulation layer, the compound layer structure being spaced apart from and not connected to the lower electric-conduction layer; and e) forming a first pad layer formed on the insulation layer, the first pad layer being coupled to the compound layer, wherein in the forming a first pad layer step e) the first pad layer and the compound layer are spaced apart from the lower electric-conduction layer.]

[20. The method according to claim 19, wherein a noise from the substrate is kept away form the first pad layer by the lower electric-conduction layer.]

[21. The method according to claim 19, wherein the forming a compound layer structure step d) further comprises the steps of:

forming at least one first electric-conduction layer on the insulation layer; and forming at least one first connecting layer on the insulation layer, wherein the first connecting layer is to couple the first electric-conduction layer to the first pad layer.]

[22. The method according to claim 21, wherein the area of the first electric-conduction layer is smaller than that of the first pad layer.]

*23. An integrated circuit (IC) device having a pad structure formed thereon, the IC device comprising:*

*a) a substrate;*

*b) an insulation layer formed on the substrate;*

*c) a plurality of electric-conduction layers formed in the insulation layer, including a lower electric-conduction layer, each electric-conduction layer having a thickness;*

*d) a plurality of connecting layers, each connecting layer having a thickness, the connection layers interposed between the electric-conduction layers, the plurality of connecting layers selectively coupling one or more of the electric-conduction layers;*

*e) a compound layer structure formed in the insulation layer;*

*f) a first pad layer formed on the insulation layer and coupled to the compound layer structure, wherein the first pad layer and the compound layer structure are spaced apart and above from the lower electric-conduction layer, wherein the compound layer structure and the lower electric-conduction layer are spaced apart by the thickness of at least one electric-conduction layer and the thickness of at least one connecting layer; and*

*g) a second pad layer formed on the insulation layer and coupled to the lower electric-conduction layer.*

*24. The IC device according to claim 23, wherein the compound layer structure comprises a first electric-conduction layer and a first connecting layer to couple the first electric-conduction layer to the first pad layer.*

*25. The IC device according to claim 24, wherein the first connecting layer comprises a plurality of via plugs.*

*26. The IC device according to claim 24, wherein the first electric-conduction layer is shaped like a webbed railing.*

*27. The IC device according to claim 24, wherein the area of the first electric-conduction layer is smaller than that of the first pad layer.*

*28. The IC device according to claim 23, wherein the first pad layer is shaped like a polygon.*

*29. The IC device according to claim 23, further comprising a passivation layer formed on the insulation layer to cover a part of the outer rim of at least one of the first and second pad layers.*

*30. The IC device according to claim 23, further comprising at least one second connecting layer for coupling the second pad layer to the lower electric-conduction layer.*

*31. The IC device according to claim 30, further comprising at least one second electric-conduction layer coupled between the second pad layer and the lower electric-conduction layer with the second connecting layer.*

*32. An integrated circuit (IC) device having a pad structure formed thereon, the IC device comprising:*

*a) a substrate;*

*b) an insulation layer formed on the substrate;*

*c) a lower electric-conduction layer formed in the insulation layer;*

*d) a compound layer structure formed in the insulation layer;*

*e) a first pad layer formed on the insulation layer and coupled to the compound layer structure, wherein the first pad layer and the compound layer structure are spaced apart from the lower electric-conduction layer; and*

*f) a second pad layer formed on the insulation layer and coupled to the lower electric-conduction layer, wherein a noise from the substrate is kept away from the first pad layer by the lower electric-conduction layer.*

*33. An integrated circuit (IC) device having a pad structure formed thereon, the IC device comprising:*

*a) a substrate;*

*b) an insulation layer formed on the substrate;*

*c) a lower electric-conduction layer formed in the insulation layer;*

*d) a compound layer structure formed in the insulation layer;*

*e) a first pad layer formed on the insulation layer and coupled to the compound layer structure, wherein the first pad layer and the compound layer structure are spaced apart from the lower electric-conduction layer; and*

*f) a second pad layer formed on the insulation layer and coupled to the lower electric-conduction layer.*

*34. The IC device according to claim 33, wherein the compound layer structure comprises a first electric-conduction layer and a first connecting layer to couple the first electric-conduction layer to the first pad layer.*

*35. The IC device according to claim 33, further comprising at least one second connecting layer for coupling the second pad layer to the lower electric-conduction layer; and at least one second electric-conduction layer coupled between the second pad layer and the lower electric-conduction layer with the second connecting layer.*

*36. The IC device according to claim 35, wherein, the area of the first electric-conduction layer is smaller than that of the first pad layer.*

*37. The IC device according to claim 33, wherein the first pad layer is shaped like a polygon.*

*38. The IC device according to claim 33, further comprising a passivation layer formed on the insulation layer to cover a part of the outer rim of at least one of the first and second pad layers.*

* * * * *